United States Patent
Luk

(10) Patent No.: US 6,846,094 B2
(45) Date of Patent: Jan. 25, 2005

(54) FLEXIBLE LED LIGHTING STRIP

(75) Inventor: John F. Luk, Flushing, NY (US)

(73) Assignee: Altman Stage Lighting, Co., Inc., Yonkers, NY (US)

(*) Notice: Subject to any disclaimer, the term of this patent is extended or adjusted under 35 U.S.C. 154(b) by 0 days.

(21) Appl. No.: 10/227,710

(22) Filed: Aug. 26, 2002

(65) Prior Publication Data

US 2004/0037079 A1 Feb. 26, 2004

(51) Int. Cl.$^7$ ............................................. F21V 4/00
(52) U.S. Cl. ........................................ 362/252; 362/240
(58) Field of Search .......................... 362/84, 227, 230, 362/231, 240, 244, 249–252, 555

(56) References Cited

U.S. PATENT DOCUMENTS 5,155,669 A * 10/1992 Yamuro ...................... 362/252
5,485,355 A * 1/1996 Voskoboinik et al. ......... 362/84

(List continued on next page.)

FOREIGN PATENT DOCUMENTS

| EP | 1128127 | 8/2001 |
|---|---|---|
| EP | 1152184 | 11/2001 |
| EP | 1178260 | 2/2002 |
| GB | 2071837 | 9/1981 |

OTHER PUBLICATIONS

Color Kinetics iColor Accent Datasheet, web page print out, BR0091 Rev. 00, 2002.
Color Kinetics iColor Cove Datasheet, web page print out, BR0013 Rev. 07, 2001.
Color Kinetics iColor Fresco Datasheet, web page print out, BR0046 Rev. 04, 2001–2002.
Gelcore Tetra LED System Datasheet, web page print out, publication No.: 092501, dated Sep. 28, 2001.
Lumileds ChipStrip Contour Lighting System Technical Datasheet, web page print out, dated Feb. 28, 2002, obsoletes DS16 (11/00) and DS16 (05/01).

*Primary Examiner*—Alan Cariaso
(74) *Attorney, Agent, or Firm*—Lackenbach Siegel LLP

(57) ABSTRACT

A flexible lighting device, comprising an elongated flexible tube including a translucent tubular shell with opposed tube ends, a flexible helical circuit board positioned in said tube extending between said opposed tube ends, said flexible helical circuit board having an exterior surface spaced from said tubular shell. Electrical circuitry is mounted to the circuit board and is connected to an external input source and an output source of electrical power. A plurality of light emitting diodes (LEDs) is mounted to the exterior surface of the helical circuit board and is electrically connected to the electrical circuitry. The LEDs are positioned adjacent to the tubular wall. The invention includes a method of making the flexible lighting device including providing a parallelogram-shaped flat circuit board having long edges and short edges with acute angles and obtuse angles and further including a stiffening member embedded with said flat circuit board. Electrical circuitry mounted to the flat circuit board and LEDs mounted to the flat circuit board and to the electrical circuitry thereon, are all rolled and extended into a flexible cylindrical circuit board having spaced spirals and gaps that hold the LEDs, and then inserted into the flexible tubular housing. Power input and power output connectors are added to the electrical circuitry of the flexible helical circuit board, and connector end caps are secured to the opposed ends of the tubular housing.

3 Claims, 17 Drawing Sheets

U.S. PATENT DOCUMENTS

| | | | |
|---|---|---|---|
| 5,552,971 A * | 9/1996 | Madden ........................ 362/84 |
| 5,711,594 A * | 1/1998 | Hay ............................ 362/84 |
| 5,871,271 A * | 2/1999 | Chien ......................... 362/106 |
| 5,879,069 A * | 3/1999 | Chien .......................... 362/84 |
| 5,911,493 A | 6/1999 | Walker et al. |
| 6,082,867 A * | 7/2000 | Chien .......................... 362/84 |
| 6,179,440 B1 | 1/2001 | Palmer |
| 6,379,190 B1 | 4/2002 | Prazoff |
| 6,394,623 B1 | 5/2002 | Tsui |
| 6,394,626 B1 | 5/2002 | McColloch |
| 6,406,166 B1 | 6/2002 | Ko |
| 6,580,228 B1 * | 6/2003 | Chen et al. ................. 362/240 |
| 2002/0027778 A1 | 3/2002 | Ko |
| 2002/0027780 A1 | 3/2002 | Ko |
| 2002/0071276 A1 * | 6/2002 | Blum ........................ 362/250 |
| 2003/0090910 A1 * | 5/2003 | Chen ........................ 362/555 |

\* cited by examiner

SECTION II-II

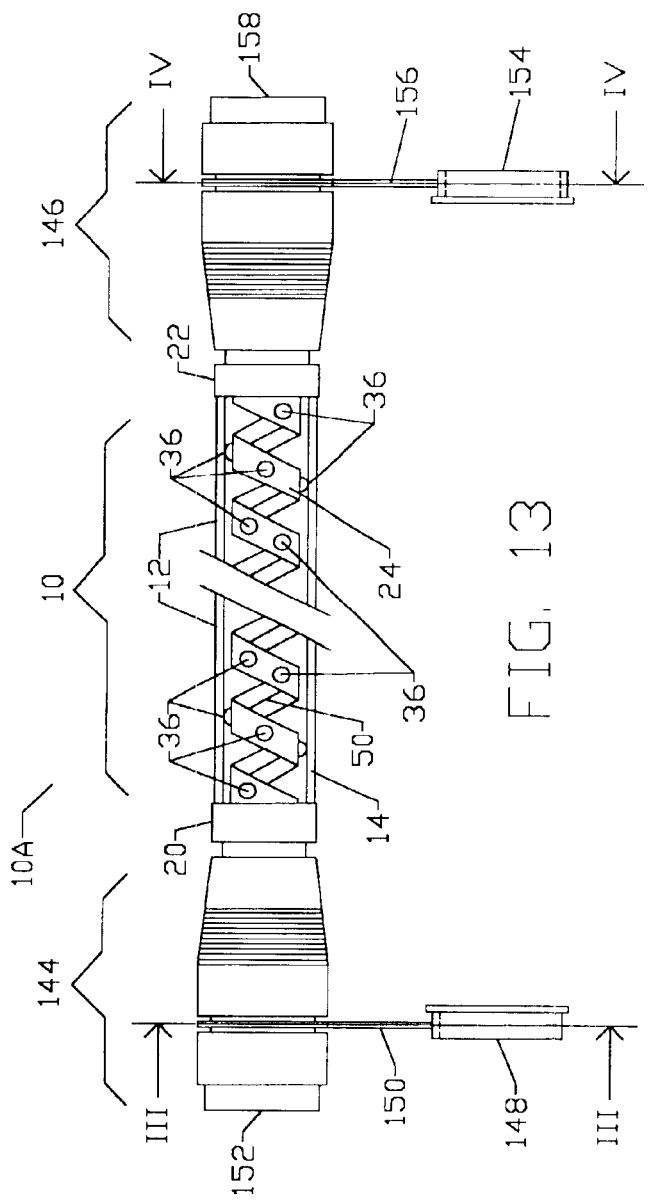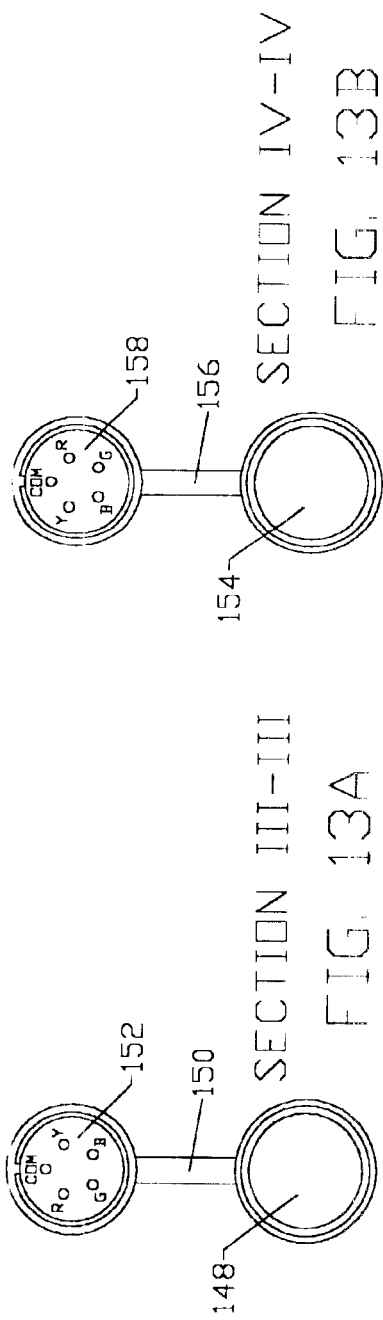

FLEXIBLE LED LIGHTING STRIP

FIELD OF THE INVENTION

This invention is directed to flexible lighting strips.

BACKGROUND OF THE INVENTION

Flexible lighting strips, also called rope lights, are used for lighting both interior and exterior structures and can be used for sign applications. Existing lighting strips do not allow a combination of flexibility and rigidity desired by users to configure rope lights into any selected configuration with ease. Color chasing and color mixing capabilities are limited.

Prior art in the sign industry includes the use of neon lamps, fluorescent lamps, and incandescent lamps. The drawbacks for neon and fluorescent lamps include difficulty in starting in cold temperatures, dangerous high-voltage operation, and the presence of mercury that in turn creates an environmental hazard. Incandescent lamps generate a large amount of heat, have poor resistance to vibration, have short lamp life, and consume large amounts of energy with the result that most of their light energy is wasted as infrared heat energy.

Light emitting diode (LED) technology makes possible the replacement of short lamp life with longer lamp life and energy deficient light sources using energy efficient light sources that are long lived and cooler running. Color output LEDs can emit red (R), green (G), blue (B), and yellow (Y) light, or white light. Brighter color mixing with better color rendering than in prior art technology is a result. Color additive mixing of LEDs can produce the secondary colors cyan (C), yellow (Y), magenta (M) and white light. Mixing green and blue gives cyan. Mixing green and red gives yellow. Mixing red and blue gives magenta. Mixing RGB plus a separate Y generates a truer white light with better color rendering than just combining RGB.

It is noted that color gel filters are not necessary with RGBY color mixing light technology, which in itself generates the full light spectrum. Color efficiency in LEDs is much better than incandescent filament lamps, which require a specific color gel or filter. This can waste up to about 90 percent of the light energy of incandescent lamps. LEDs on the other hand deliver 100 percent of their energy as light and further emit a more intense selected colored light. This energy efficiency of LEDs extends to the emitting of white light as well. There are two ways of using LEDs to produce white light in this invention: 1) using LEDs that produce white light exclusively, or 2) using LEDs to emit RGBY at the same time and at equal output intensities.

Besides generating less heat, LEDs are more energy efficient, more durable, and last longer than conventional light sources. The solid state design of LEDs makes them durable and robust and gives them the capability of withstanding shock, vibration, frequent power cycling and operation in extreme cold and hot temperatures. LEDs have an average usable life of typically 100,000 hours or more when operated within design specifications. LEDs are mercury free. LED technology now includes multi-chip and multi-light LED arrays, so that LEDs are available in a wide range of colors in unique combinations. Clearly for many applications LEDs now compete directly with incandescent filament, neon, and fluorescent light sources.

In the preferred embodiment of the present invention, light-emitting diodes in different colors can be mounted onto a flexible circuit board that is twisted into a helix and inserted into a flexible tubular housing. This unique combination of a flexible circuit board and a flexible tubular housing will allow for a more versatile and improved flexible shape retaining rope light. In addition, the ease of manufacturability and full 360-degree omni-directional and uniform light dispersion is very important. Previous inventions have been developed to try and accomplish this task, but have not been successful.

Color Kinetic's iColor Accent, Cove, and Fresco line of LED fixtures are available only in rigid linear transparent or translucent housings that offer no flexibility or versatility at all. To achieve a circular arrangement, for example, multiple linear fixtures have to be aligned edge to edge to approximate the curved outline. The iColor Accent, Cove, and Fresco fixtures also use rigid circuit boards with the LEDs mounted perpendicular to the circuit boards, therefore the light dispersion output from the LEDs are generally in the forward direction offering only at most approximately 180 degrees of coverage.

Gelcore Lighting offers their Tetra LED System and Lumileds Lighting offers their Chip Strip Contour Lighting System for signage applications. Both systems consist of a series of individual LED modules mounted onto rigid circuit board disks. Each LED module that is mounted onto a rigid circuit board disk is attached by power leads to an adjacent similarly configured LED module and rigid circuit board disk, and so on. Although the power leads offer flexibility as far as configuring the location of the LED modules themselves, there is no overall protective housing for all the modules. Also, since the LEDs are mounted onto rigid circuit boards, again the light dispersion output from the LEDs are generally in the forward direction also offering only approximately no more than 180 degrees of coverage.

In U.S. Pat. No. 6,394,623 issued to Tsui in May 28, 2002, a translucent flexible rope light is disclosed and methods of forming and using the same. The invention uses exposed main conductors consisting of multi-strand wire connected to a plurality of spaced-apart lights, both extending substantially in parallel for substantially the entire length of the rope light. A flexible sheath having a continuous annular shape encases the conductors and plurality of lights. Although this invention uses a flexible tubular housing, the plurality of lights are disclosed as discrete lights wired directly together in series with the main conductors and plurality of lights positioned in a physical parallel orientation with each other throughout the length of the rope light. This invention does not employ a flexible circuit board and the configuration will not allow for a full dispersion of light output from the plurality of lights as required.

In U.S. Pat. No. 6,394,626 issued to McColloch in May 28, 2002, a flexible light track for signage is disclosed consisting of a plurality of modules separately and mechanically connected to a flexible frame to which light emitting diodes and positive and negative leads are mounted to each module. The modules are designed to be mounted flat onto the flexible frame. As this invention was designed for signage use only, an integral flexible tubular housing is not included. As before, this configuration will not allow for a full dispersion of light output from each light emitting diode mounted to each module.

Lastly, in U.S. Pat. No. 6,406,166 issued to Ko in Jun. 18, 2002, a chasing rope light is disclosed using a flexible core tube with at least two separate series string of light emitting diodes each individually connected to a diode rectifier. This rope light was designed to operate on an alternating power source such that only one series string of light emitting diodes will turn on at a time, thereby creating the chasing effect. Although this invention calls for a flexible core tube housing, it also does not employ a flexible circuit board. The major disadvantage here being not all the light emitting diodes in the separate series strings can be turned on at the same time. This invention functions only as a chasing rope light.

A light emitting diode light apparatus in accordance with the present invention that is a substantial improvement over the prior art mentioned above will be appreciated by those skilled in the art from the following summary and detailed description of the invention.

SUMMARY OF THE INVENTION

An object of the present invention is to provide a flexible LED lighting strip that can accomplish the functions of known rope lights with greater energy efficiency and omni-directional light dispersion with color mixing, color changing, and color chasing capabilities.

It is a further object of the present invention to provide a flexible LED lighting strip that is both flexible and versatile, and capable of being configured into numerous configurations and of maintaining the selected configuration.

It is yet another object of the present invention to provide a method of manufacture of a flexible LED lighting strip that is efficient and cost effective.

LEDs are available in different shapes and sizes. The LEDs used in the following examples are high luminous intensity lamp types available from Nichia Corporation. They are also readily available from other sources among which are Gelcore Lighting LLC, a joint company comprising GE Lighting and EMCORE Corporation and Lumileds Lighting LLC, a joint venture between Agilent Technologies (formerly with Hewlett Packard) and Philips Lighting. The LEDs include the 5 mm discrete axial lead types and Surface Mount Device (SMD) LED devices.

A minor drawback at present is the individual retail price of a single white LED. The cost decreases a bit when purchasing in larger quantities, but the overall cost is still high. At the present time of this application a single white LED from Nichia Corporation will cost $0.70 even when buying in quantities of 100,000 pieces. The cost of using LEDs can be justified in view of the energy savings, their lower current draw, the low profiles that can be achieved, and their low operating temperature. LEDs are also maintenance free and have a longer lamp life. The price of individual LEDs will fall as their luminous intensity and performance will continue to increase.

In addition, the direct generation of colored light by the selection of the type of LED used will make redundant the need for colored lenses with consequent improvements in efficiency, visibility, and cost. One particular use is in display and general lighting applications, where the long life characteristics of LEDs, their suitability for repetitive switching, their low operating temperature, and their high efficiency all contribute to qualify them for such use.

Those skilled in the art will further appreciate the improvements and advantages relating to the use of LEDs combined with the present invention upon reading the detailed description, which follows in conjunction with the following drawings.

BRIEF DESCRIPTION OF THE DRAWINGS

FIG. 13 is a broken side view of the flexible lighting strip as fully assembled including a transparent tubular housing with a flexible helical circuit board with LEDs mounted thereon, opposed end caps, a male plug connector and an opposed female socket connector, and opposed dust cap covers;

FIG. 13A is an end view taken through line III—III in FIG. 13;

FIG. 13B is an end view taken through line IV—IV in FIG. 13;

DETAILED DESCRIPTION OF THE INVENTION

The present invention will now be described more fully with reference to the accompanying drawings where like numbers refer to like elements throughout.

Figure 1:
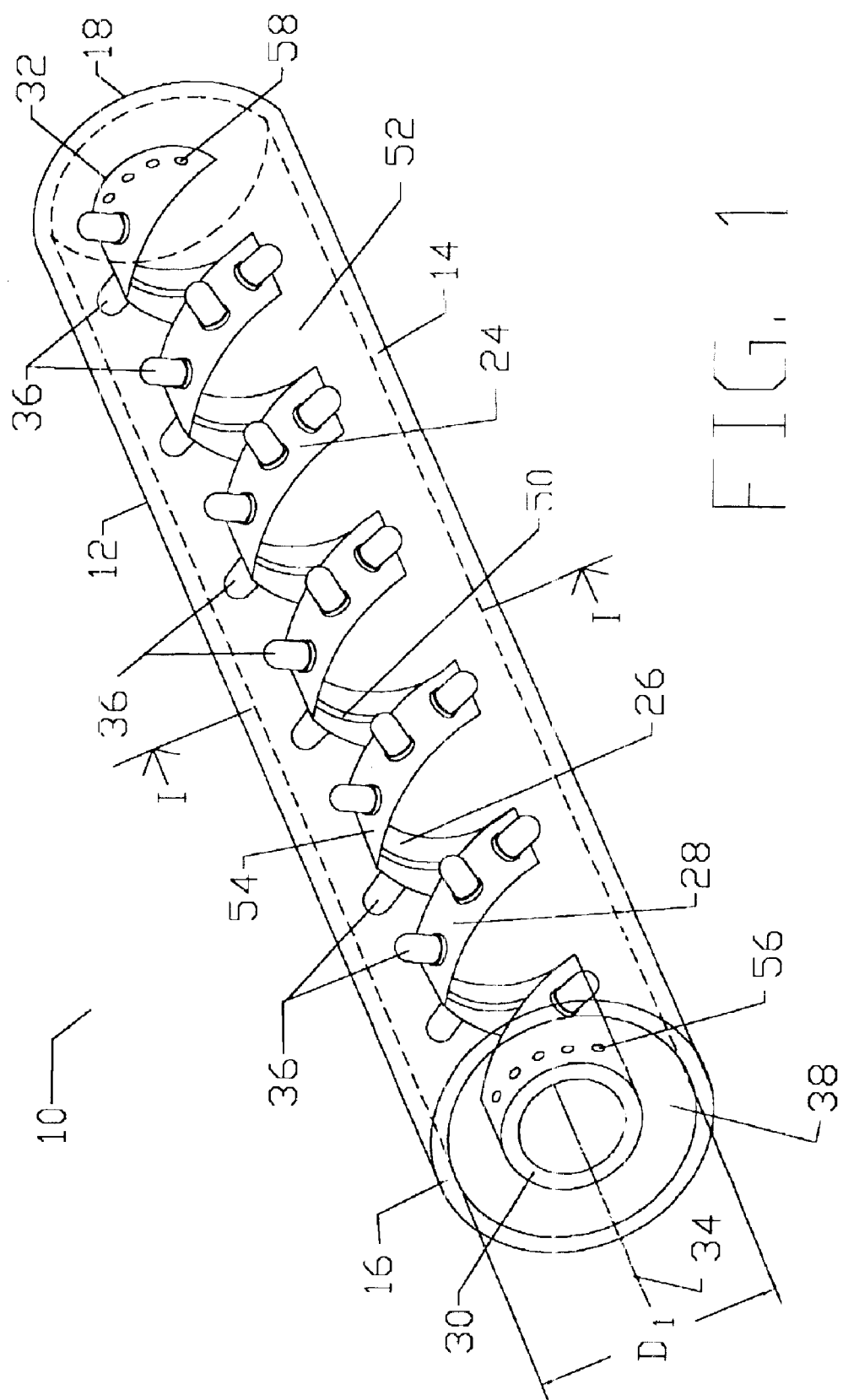
FIG. 1 is a perspective view of the flexible lighting strip in accordance with the present application.

A flexible lighting strip 10 is shown in FIG. 1. Flexible lighting strip 10 is a shortened version of a lighting strip of what is generally a more extended flexible lighting strip known in the art.

Flexible lighting strip 10 includes an elongated flexible tubular housing 12 having a smooth translucent shell, or in particular a transparent tubular shell 14 as shown, and opposed tubular ends 16 and 18 having connector end caps 20 and 22, respectively, (seen in FIG. 13) secured thereto and a flexible helical circuit board 24 configured as a open helix positioned in tubular housing 12. Flexible helical circuit board 24 is configured as a spiral helical spring having opposed continuous interior and exterior surfaces 26 and 28, respectively, and having helical circuit board opposed ends 30 and 32 positioned at tubular wall opposed ends 16 and 18, respectively. Flexible helical circuit board 24 and tubular housing 12 are both circular in cross-section and have a coextensive axis 34. A number of LEDs 36 are mounted on flexible helical circuit board 24 at equal intervals on exterior surface 28.

Figure 2:
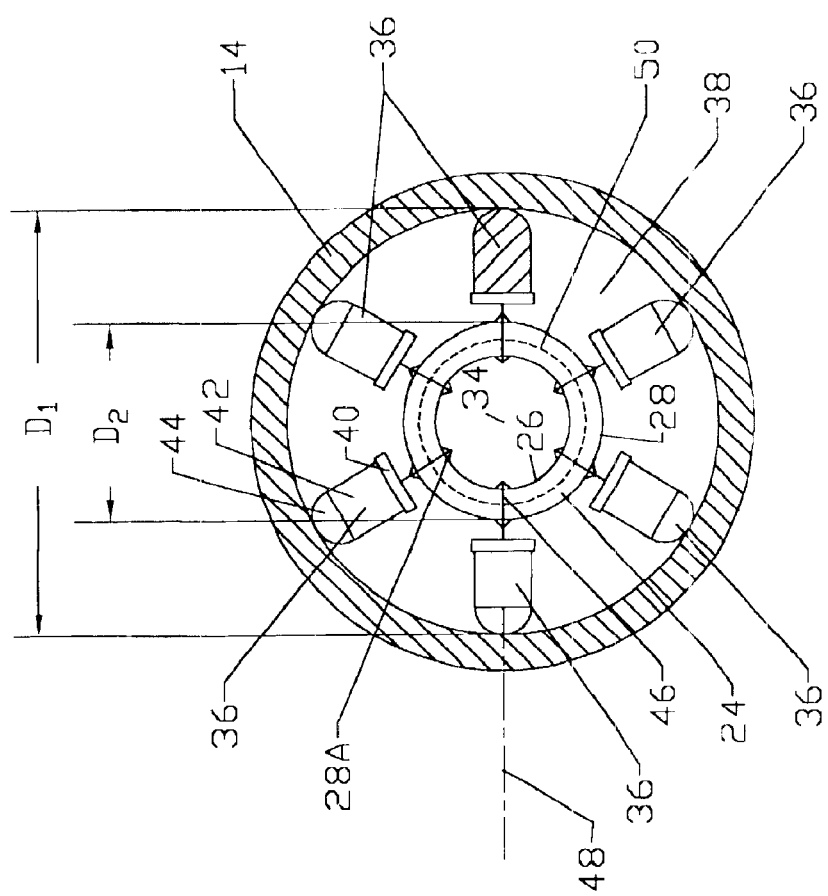
FIG. 2 is a view taken through plane I—I in FIG. 1 perpendicular to the axis of the flexible circuit board and the flexible tubular housing, through LEDs, and also showing a stiffening wire embedded in the flexible circuit board.

FIG. 2 shows a sectional plane I—I taken through flexible lighting strip 10 perpendicular to coextensive axis 34. A cylindrical space 38 is formed between flexible helical circuit board 24 and tubular shell 14. Each LED 36 includes a base portion 40, a body portion 42, and a lens portion 44. Each LED 36 has a LED centerline 48 that is perpendicular to coextensive axis 34. Lens portion 44 is adjacent to tubular shell 14. Stiff LED leads 46 mounts LEDs 36 to flexible helical circuit board 24 and electrically connects LEDs 36 to the electrical connections on flexible helical circuit board 24. LEDs 36 are positioned in cylindrical space 38 with lens portions 44 being adjacent to tubular shell 14. LEDs 36 are so positioned and aligned that the six LEDs 36 shown in FIG. 2 are a result of the regular overlapping alignment of the total of LEDs 36 located on flexible helical circuit board 24.

Flexible helical circuit board 24 is preferably made of a polyimide plastic material that can withstand the high temperatures that can occur during the process of soldering LED leads 46 thereto. A thickness of approximately a minimum of 0.01 inches of polyimide material will allow the flexibility that is integral with flexible lighting strip 10, and in addition will offer the rigidity required to maintain the shape of flexible helical circuit board 24.

Figure 5:
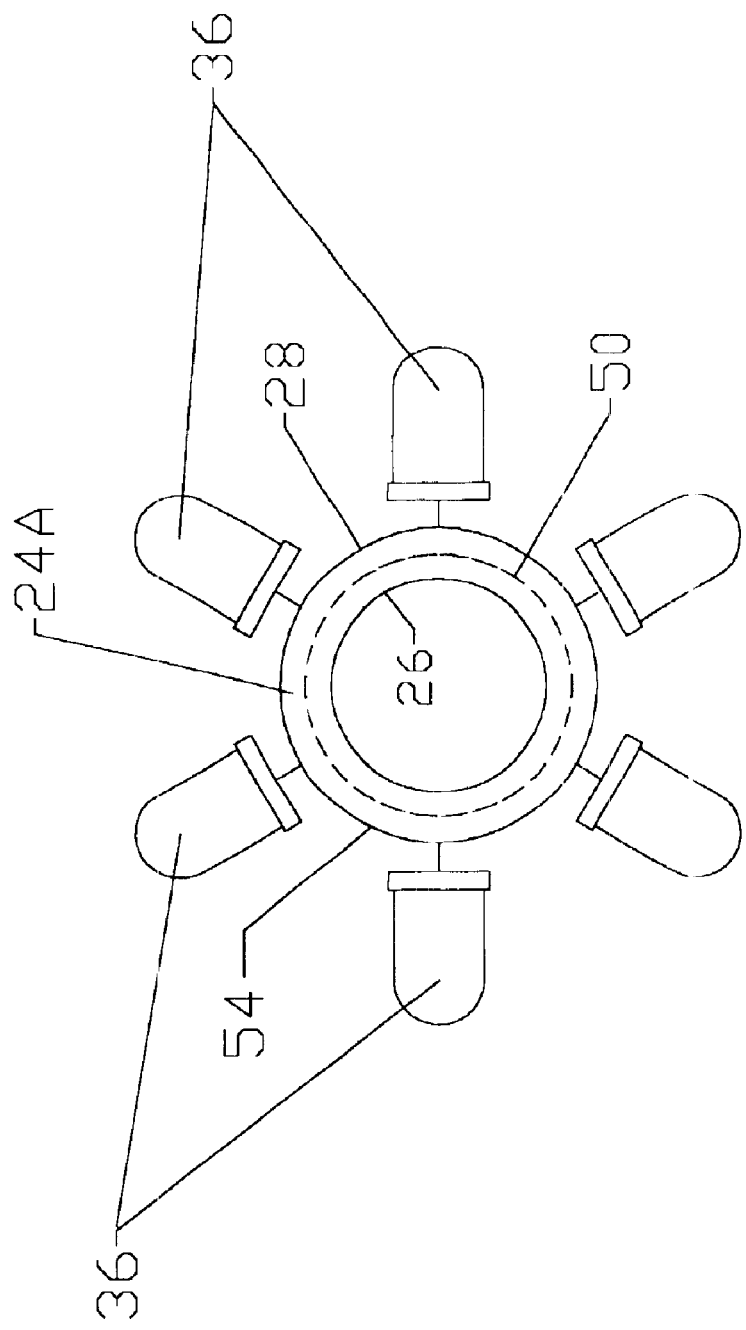
FIG. 5 is a view taken through plane II—II in FIG. 3 showing the stiffening wire.

A stiffening member particularly shown as stiffening wire 50 embedded the entire length of helical circuit board 24 between circuit board ends 30 and 32 is shown in FIG. 1 and further shown in a cross-section II—II of a single flexible spiral in FIG. 5 where stiffening wire 50 is positioned generally midway between interior surface 26 and exterior surface 28. It can be appreciated by someone skilled in the arts that the stiffening wire 50 can be positioned on interior surface 26 and/or on exterior surface 28. Stiffening wire 50 adds both added strength to flexible helical circuit board 24 and further provides the rigidity to maintain the entire flexible lighting strip 10 in the shape it is placed, for example, in a curved or looped mode, during the time of its use. Built-in stiffening wire 50 is made of metal for strength and rigidity, and as such can be electrically connected to the common or the negative DC voltage to each LED 36. Also, because stiffening member 50 is preferably made of metal, it can act as a heat sink to draw the heat generated by the LEDs 36 through the LED leads 46. LED leads 46 will extend through the entire flexible helical circuit board 24 from exterior surface 28 through interior surface 26 and held in place with solder 28A. Stiffening wire 50 is preferably made of an electrically conductive metal. Such electrically conductive metal can be, for example, substantially aluminum or copper.

Now, referring back to FIG. 3 shows compressed helical circuit board 24A in isolation prior to being inserted into tubular housing 12 in the manufacturing process, or assembly of flexible lighting strip 10. LEDs 36 are shown already connected to and positioned on compressed helical circuit board 24A, and also electrically connected to the electrical circuitry thereon in accordance with the electrical wiring diagrams shown in any of FIGS. 10, 11, and 12 as described later on.

Figure 3:
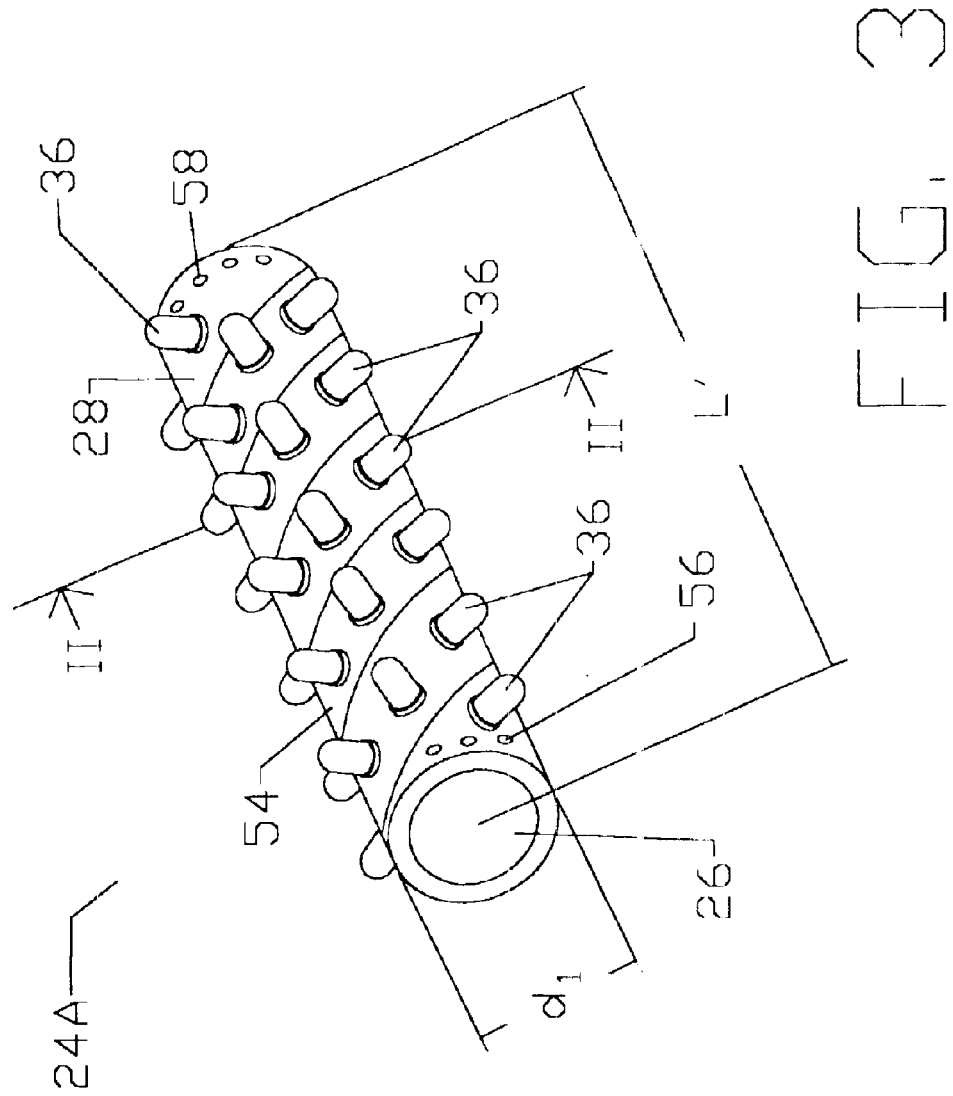
FIG. 3 is a perspective view taken in isolation of the flexible circuit board in a compressed mode with LEDs mounted thereon as shown in FIG. 1.
Figure 4:
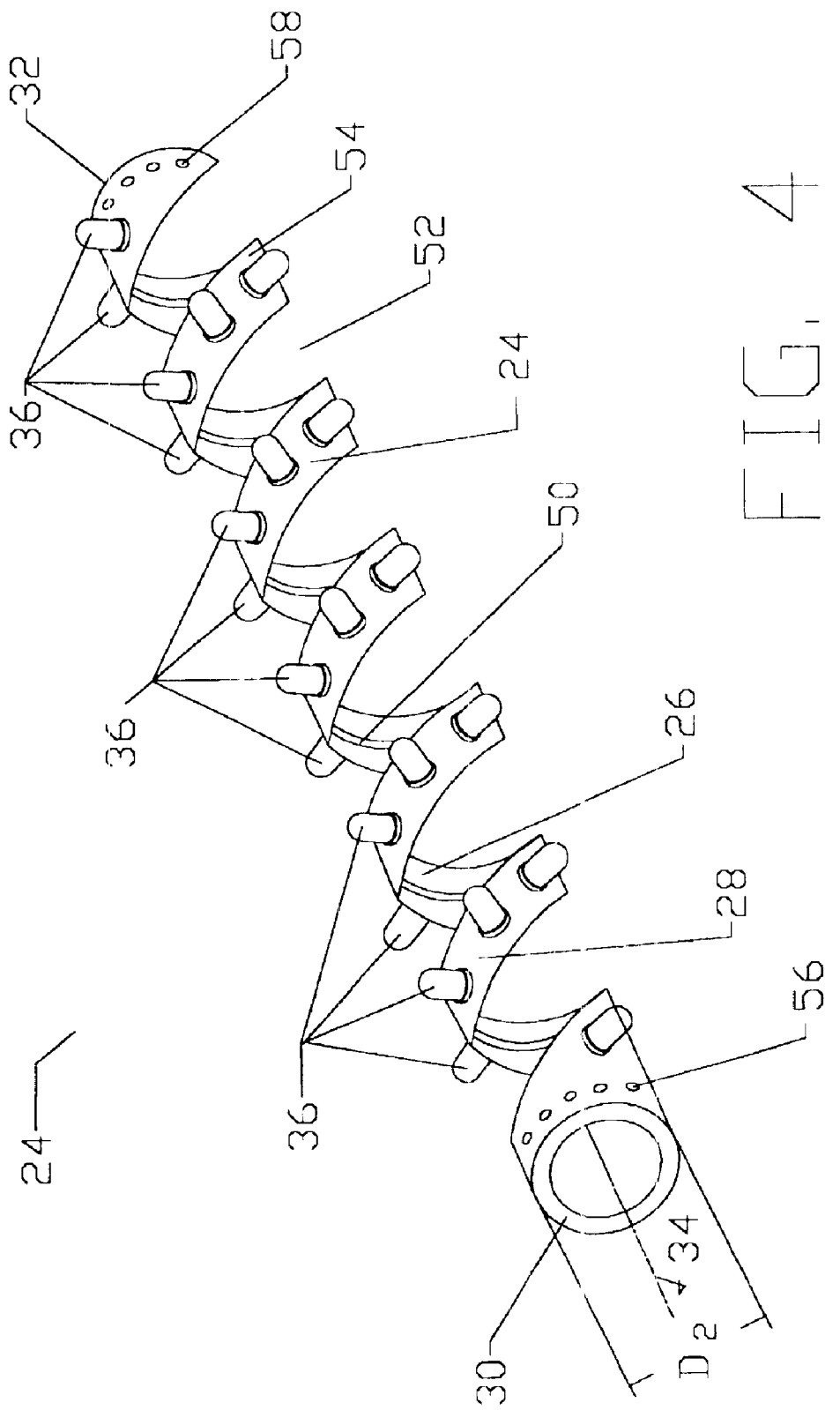
FIG. 4 is a perspective view taken in isolation of the helical flexible circuit board shown in FIG. 3 in the expanded mode in preparation for assembly.

In assembly, the compressed helical circuit board 24A, which is cylindrical in configuration as shown in FIG. 3, is pulled or extended into the uncompressed mode or configuration shown as flexible helical circuit board 24 in FIG. 4. The outer diameter $D_2$ of uncompressed flexible helical circuit board 24, which is shown in FIGS. 2 and 4, is reduced relative to the slightly larger diameter $d_1$ in the compressed helical circuit board 24A seen in FIG. 3. In the uncompressed or expanded mode, flexible helical circuit board 24 is configured as a true helix with a space or gap 52, defined between each helical spiral 54 so that flexibility of flexible helical circuit board 24 is achieved. Preferably gaps 52 shown in FIG. 4 between each helical spiral 54 is equal to the width of the compressed helical circuit board 24A for maximum flexibility. The flexible lighting strip 10 can be laid out so that there is adequate omni-directional light coverage around the complete circumference of the elongated flexible tubular housing 12.

Figure 6:
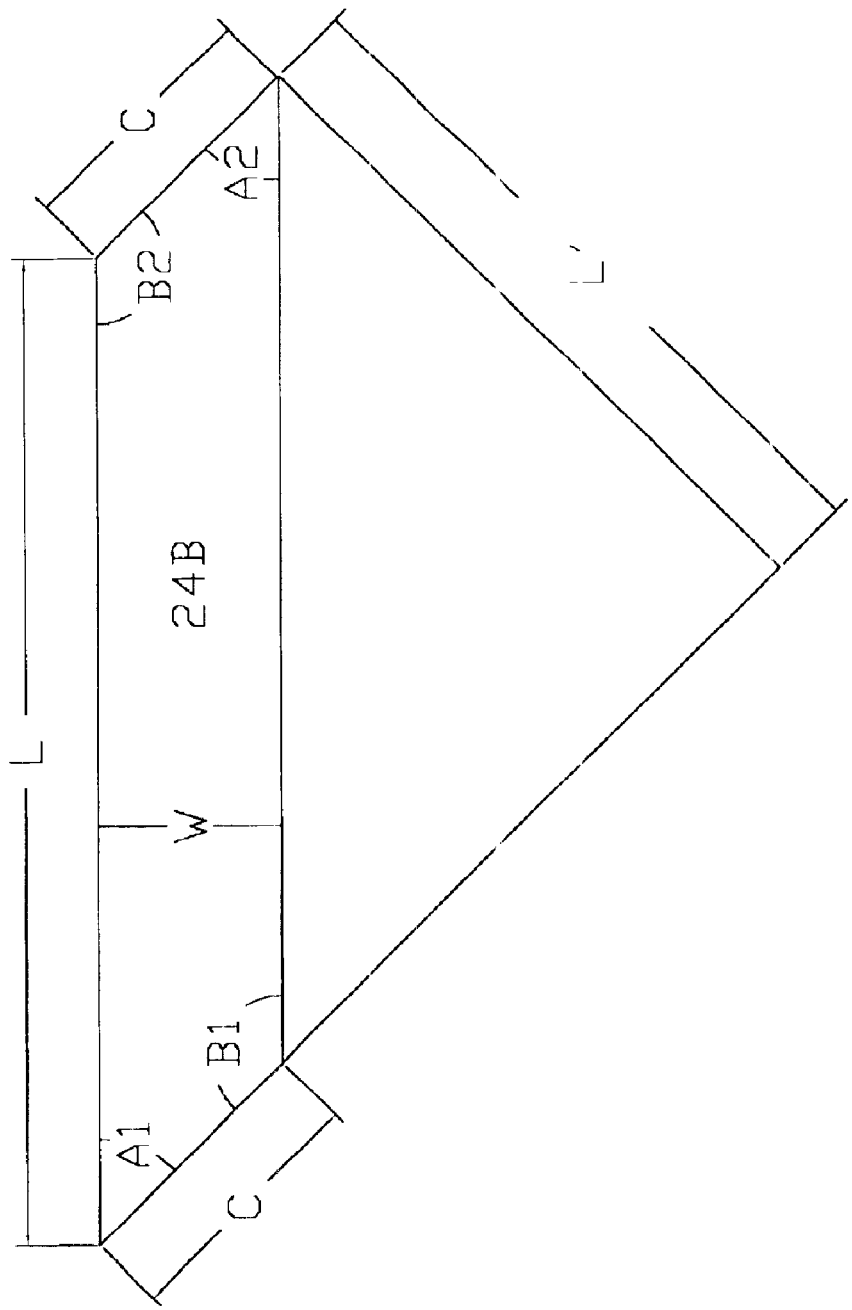
FIG. 6 is a flat view of a flexible circuit board prior to the mounting of LEDs, electrical circuitry and electrical components showing the outside surface of the circuit board and prior to it being formed into a compressed helical circuit board such as that shown in FIG. 3.

The method of constructing compressed helical circuit board 24A is illustrated in conjunction with FIG. 6, which shows a flat mode representation of a parallelogram-shaped flat mode circuit board 24B in preparation for the construction of flexible helical circuit board 24. Flat mode circuit board 24B is made of a flexible electrically non-conductive and high-temperature resistant plastic material such as, for example, polyimide. FIG. 6 shows flat mode circuit board 24B with the exterior surface 28 of flexible helical circuit board 24 facing upwards. The following designations and formulas refer to the flat mode representation of flat mode circuit board 24B of FIG. 6.

Short edges C of parallelogram-shaped flat mode circuit board 24B equals the circumference C of compressed helical circuit board 24A of FIG. 3=$d_1 \times pi$ (3.1415927).

From FIG. 3, long edges L of parallelogram flat mode equals length L' of compressed helical circuit board 24A divided by sine $A_1$=sine 45°=0.7071.

Flat mode circuit board 24B shown in FIG. 6 has an exterior surface 28 facing upwards and configured as a parallelogram in preparation for formation to a cylindrical compressed circuit board such as compressed helical circuit board 24A shown in FIG. 3.

Parallelogram-shaped flat mode circuit board 24B includes two long opposed parallel edges L and two short opposed parallel edges C that form opposed 45° angles $A_1$ and $A_2$ and opposed 135° angles $B_1$ and $B_2$. It can be appreciated by someone skilled in the arts to create a parallelogram-shaped flat mode circuit board with acute angles other than 45° and obtuse angles other than 135°. The number of helical spirals 54, such as, for example, the six helical spirals 54 as seen in FIG. 3, is determined by length L' divided by the circumference C.

The width W of the compressed helical circuit board 24A is equal to the circumference C multiplied by the sine of angle $A_1$ or $A_2$ or 45° in this example. Taking this into consideration, in order to compensate for the open helical spirals, the length L' of compressed helical circuit board 24A as shown in FIG. 3 and the starting diameter $d_1$ of compressed helical circuit board 24A should be doubled. For the preferred embodiment of the present invention of flexible lighting strip 10 as shown in FIGS. 1 and 2, Diameter $D_2$ of uncompressed flexible helical circuit board 24 is equal to the inside diameter $D_1$ of flexible tubular housing 12 shown in FIG. 1 minus twice the height of the LEDs 36 including LED lead 46 shown in FIG. 2.

Figure 7:
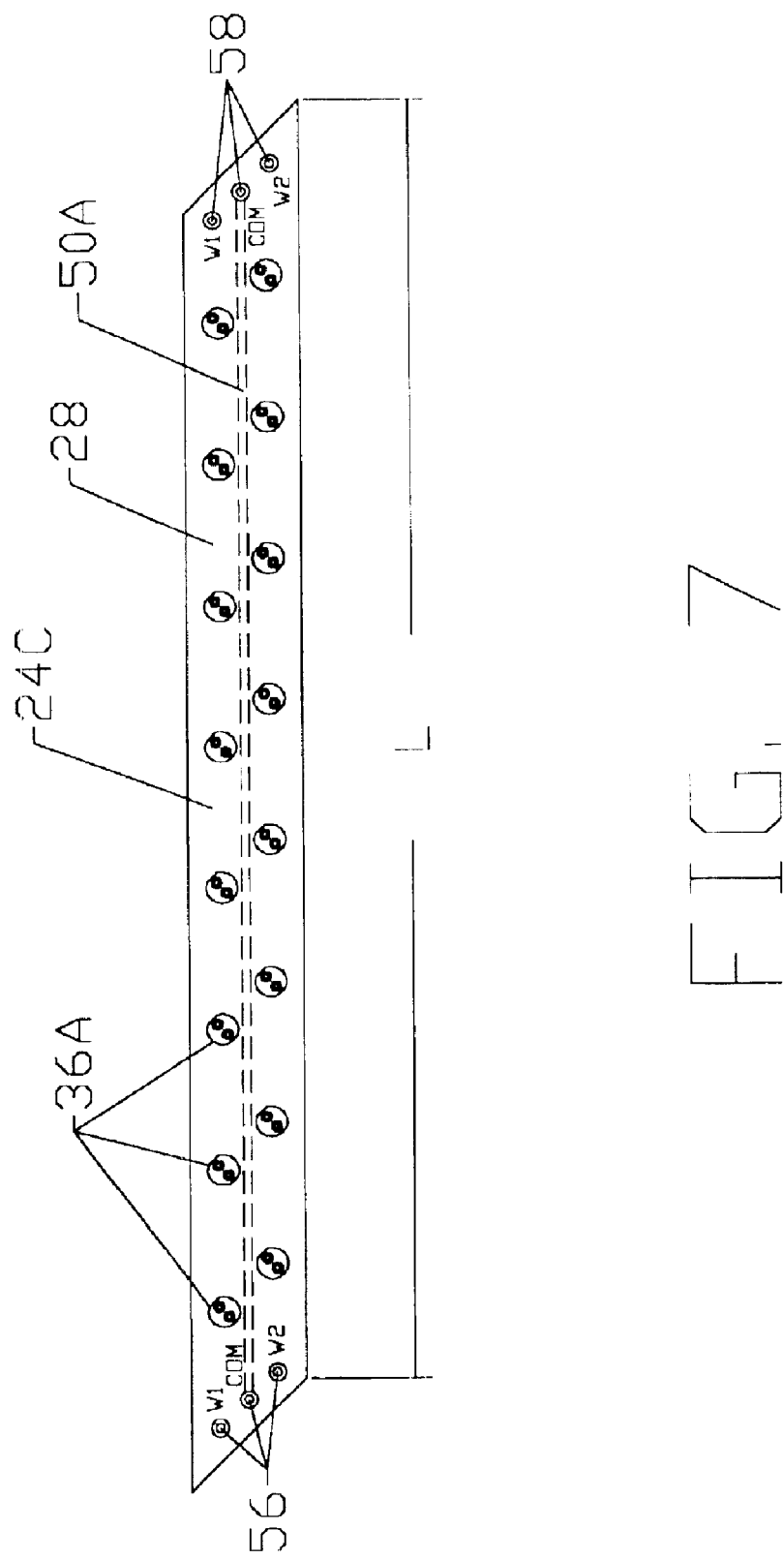
FIG. 7 shows a top view of a flexible circuit board in a flat mode prior to being formed into a compressed helical configuration such as seen in FIG. 3 with white LEDs mounted and held thereon, and also showing a stiffening wire embedded therein.

A further example of flat mode circuit board 24B is shown in FIG. 7 as flat mode circuit board 24C where an example of 16 white LEDs 36A are shown located on both sides of stiffening wire 50A that extends substantially the entire length L between short sides C. A power input 56 and a power output 58 are mounted in flat circuit board 24C at opposed short ends C for white LEDs 36A. White LEDs 36A are mounted perpendicular to exterior surface 28.

Figure 8:
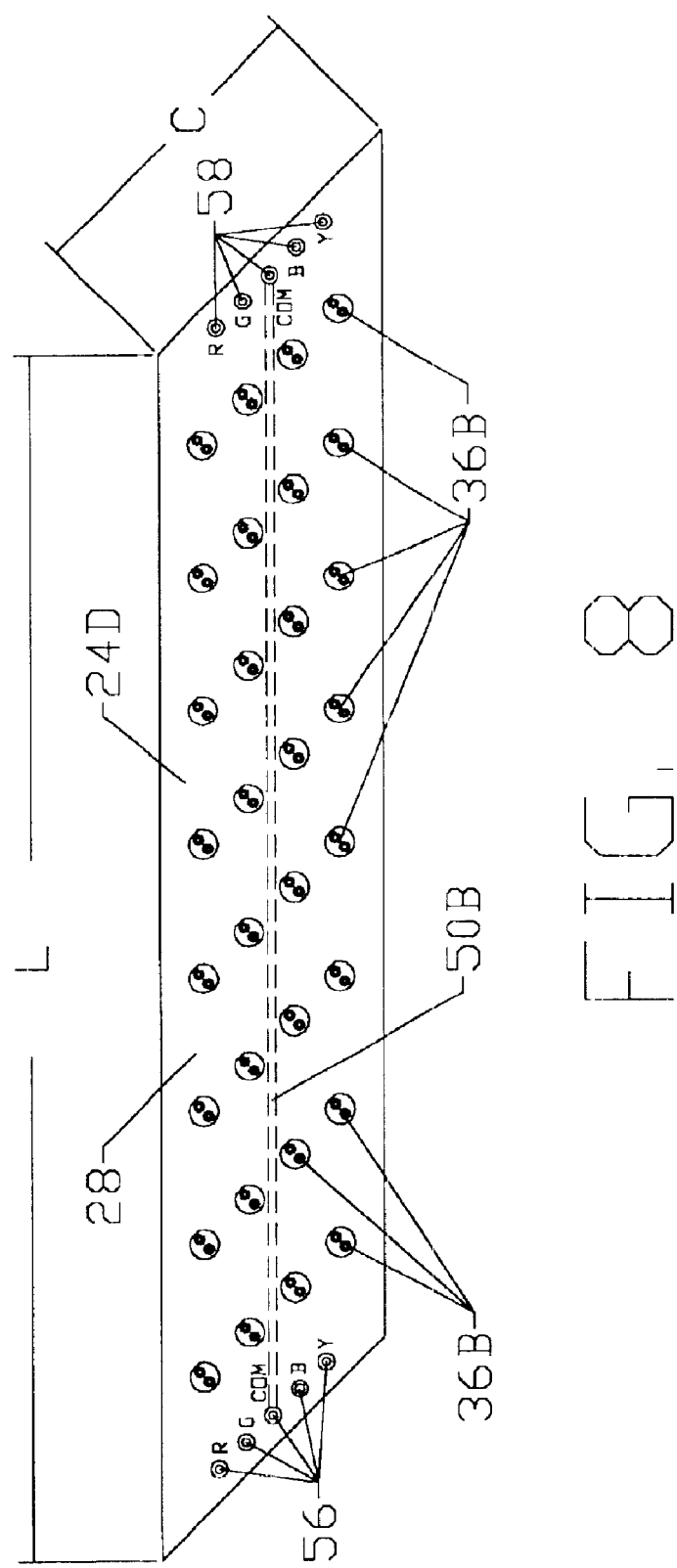
FIG. 8 shows a top view of a flexible circuit board in a flat mode prior to being formed into a compressed helical configuration such as seen in FIG. 3 with RGBY LEDs mounted and held thereon, and also showing a stiffening wire embedded therein.

Another example of flat mode circuit board 24B is shown in FIG. 8 as flat mode circuit board 24D where an example of 32 RGBY (color) LEDs 36B are shown located on both sides of a stiffening wire 50B that extends the length L between short sides C. A power input 56 and a power output 58 both known in the art are mounted in flat circuit board 24D at opposed short ends C for RGBY LEDs 36B. RGBY LEDs 36B are mounted perpendicular to exterior surface 28.

Figure 9:
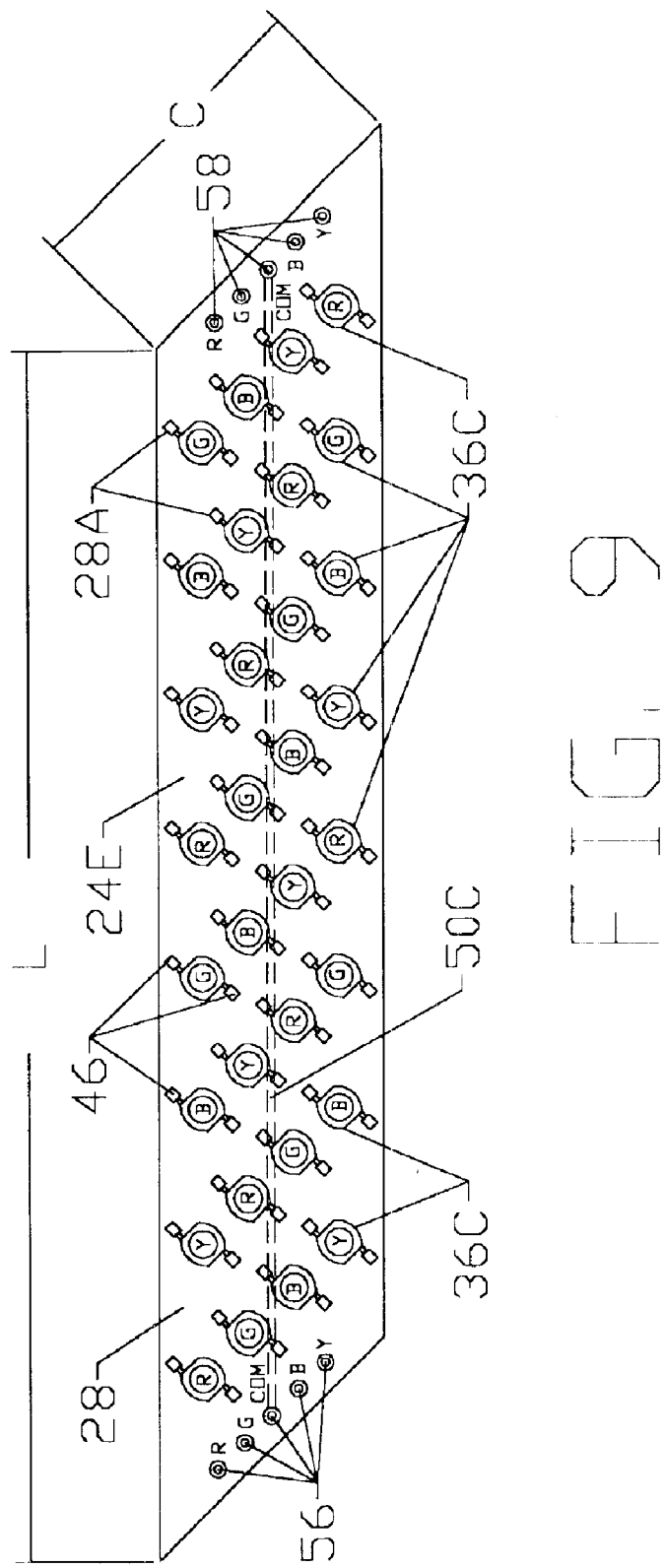
FIG. 9 shows a top view of a flexible circuit board in a flat mode prior to being formed into a compressed helical configuration such as seen in FIG. 3 with RGBY SMD LEDs mounted and held thereon, and also showing stiffening wire embedded therein.

Another example of flat mode flexible circuit board 24B is shown in FIG. 9 as flat mode circuit board 24E where an example of 32 RGBY (color) SMD LEDs 36C are shown located on both sides of a stiffening wire 50C that extends the length L between short sides C. A power input 56 and a power output 58 are mounted in flat circuit board 24E at opposed short ends C for RGBY SMD LEDs 36C. RGBY SMD LEDs 36C are mounted perpendicular to exterior surface 28.

Surface mounted device or SMD LEDs are semiconductor devices that have leads that are soldered usually on the same side of the circuit board as the electrical components. SMD LEDs are smaller and have a greater beam spread than standard discrete axial LEDs.

LED leads 46 for RGBY SMD LEDs 36C as shown in FIG. 9 are mounted directly to helical circuit board 24 on exterior surface 28. SMD LED leads 46 and RGBY SMD LEDs 36C themselves are held in place with solder 28A.

Figure 10:
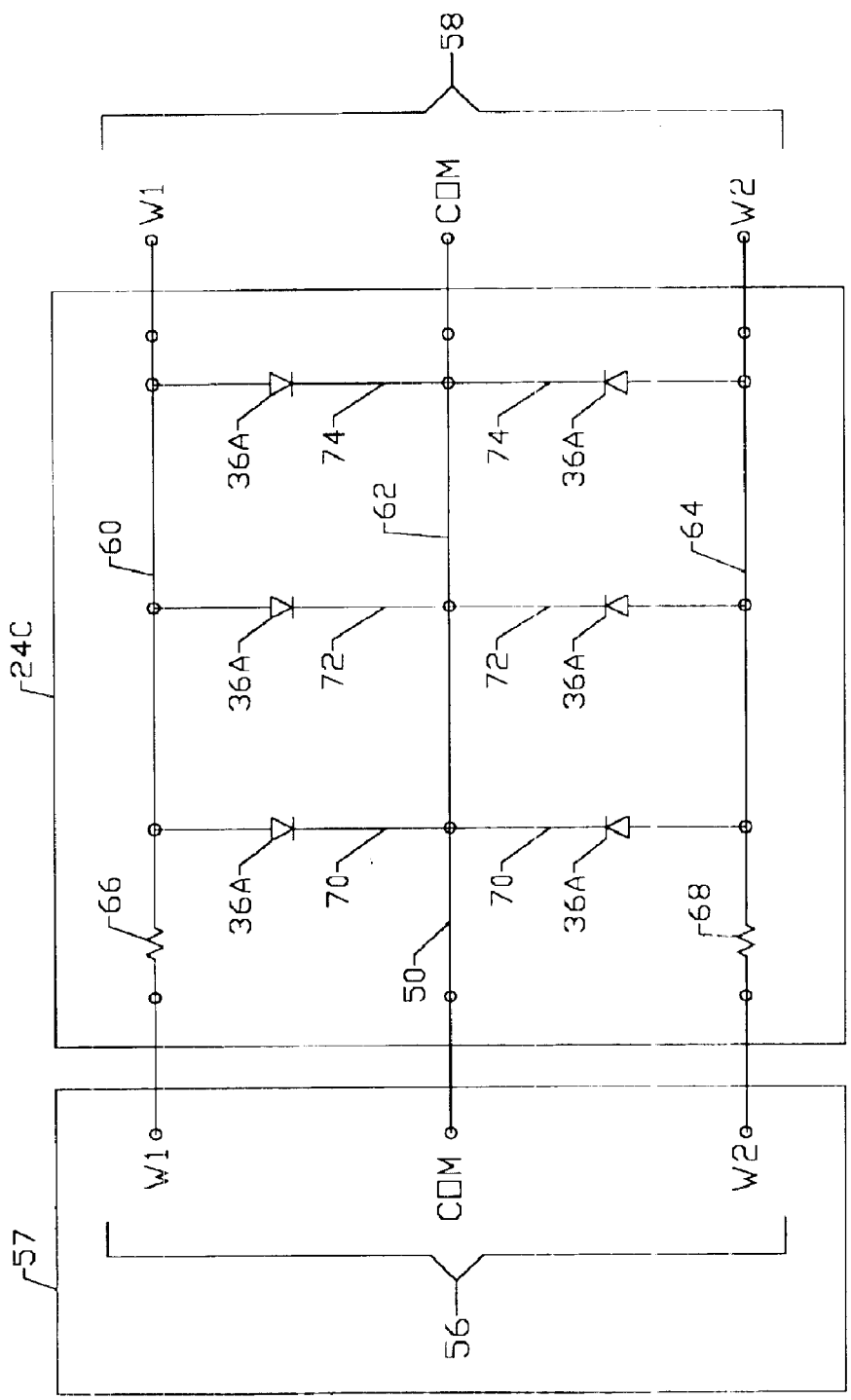
FIG. 10 is a schematic electrical circuit diagram showing the external power supply and controller for a chasing circuit for the white LEDs shown in FIG. 7 for the most part mounted onto the flexible circuit board.

FIG. 10 is a schematic electrical circuit diagram showing the external power supply and controller 57 for a chasing circuit for the white LEDs 36A shown in FIG. 7 for the most part mounted onto the flat mode circuit board 24C. An external LED power supply and controller 57 provides two separate control voltages W1 and W2 to drive LEDs 36A. A single white LED 36A is connected in a parallel configuration with other single white LED 36A. Because voltages W1 and W2 are independent of each other, they can be turned on and off individually and at full intensity to create an alternating chasing effect. Also, the external LED power supply and controller 57 can vary the voltages W1 and W2, thereby varying the current going into each white LED 36A. This in turn will cause all white LEDs 36A connected to voltages W1 or W2 to dim and/or to fade. Schematically indicated flat circuit board 24C has mounted thereon a first wire lead 60, a common (COM) second lead wire 62, and a third lead wire 64 all of which extend between external power input 56 and external power output 58 known in the art. Common (COM) second lead wire 62 is positioned between first and third lead wires 60 and 64. First and third lead wires 60 and 64 have optional resistors 66 and 68, respectively, mounted thereto. Optional resistors 66 and 68 are provided to limit the current seen by each LED 36A connected in parallel. Parallel cross-lead wires 70, 72 and 74 are connected to first lead wire 60, common (COM) second lead wire 62, and third lead wire 64. Cross-lead wire 70 is positioned in parallel to second and third cross-lead wires 72 and 74. A first pair of white LEDs 36A is mounted to cross-lead 70 on either side of common (COM) second lead wire 62 with current passing to common (COM) second lead wire 62. A second pair of white LEDs 36A is mounted on cross-lead 72 in parallel connection with white LEDs 36A on cross-leads 70 and 74 on either side of common (COM) second lead wire 62 with current passing to common (COM) second lead wire 62. A third pair of white LEDs 36A is mounted on cross-lead 74 in parallel connection with white LEDs 36A on cross-leads 70 and 72 on either side of common (COM) second lead wire 62 with current passing to common (COM) second lead wire 62. Six white LEDs 36A are shown as examples of white LEDs in parallel connection ready for chasing control, but many more white LEDs 36A can be mounted to flat mode circuit board 24C in accordance with the present invention.

Figure 11:
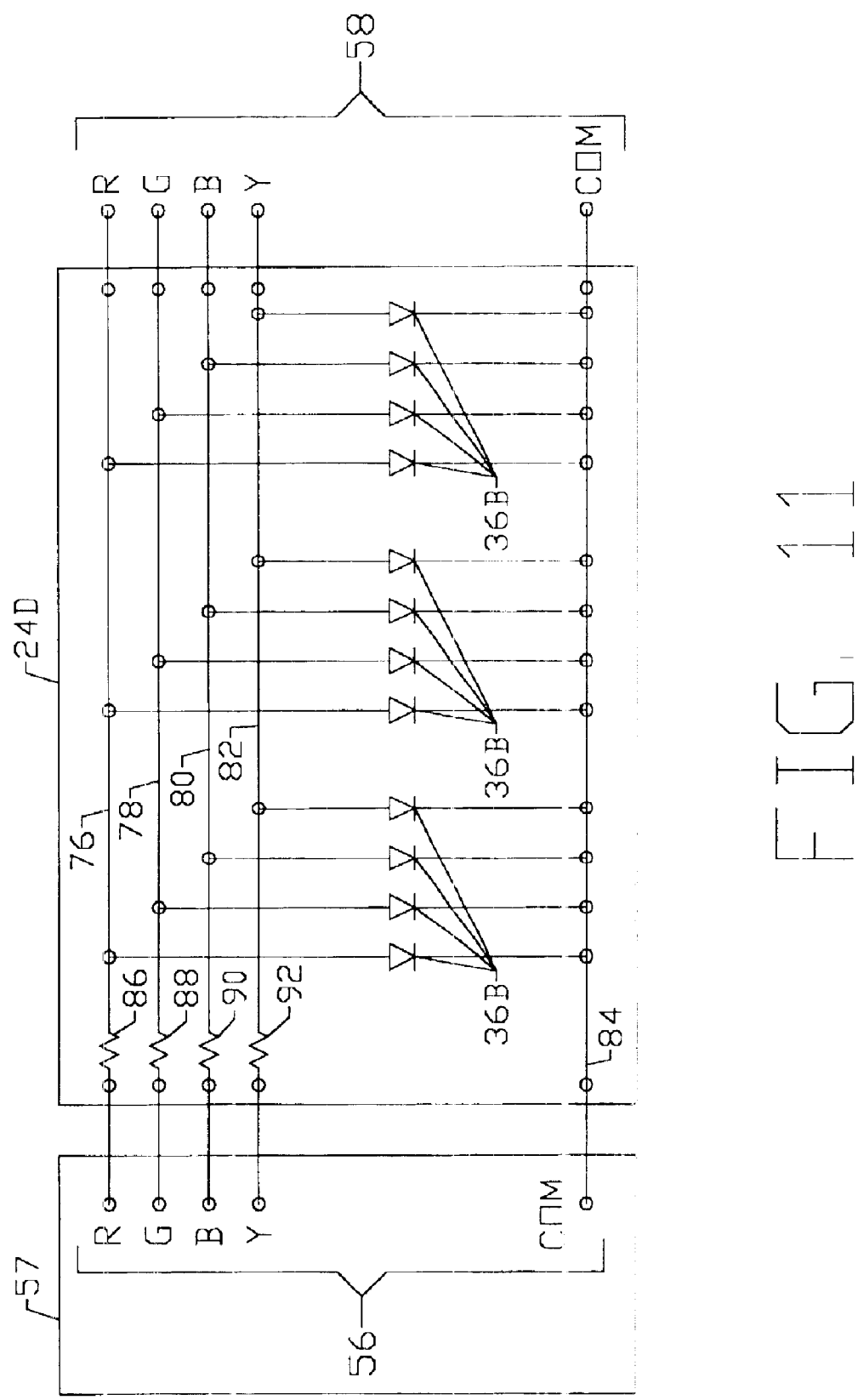
FIG. 11 is a schematic electrical circuit diagram showing the external power supply and controller for color mixing and color changing of the RGBY LEDs shown in FIG. 8 for the most part mounted onto the flexible circuit board.

FIG. 11 is a schematic electrical circuit diagram showing the external LED power supply and controller 57 for color mixing and color changing of the 32 RGBY LEDs 36B shown in FIG. 8 for the most part mounted onto flat circuit board 24D. For purposes of illustration, FIG. 11 shows 12 RGBY LEDs 36B, but it is to be understood that the same electrical schematic relationship would apply to the 32 RGBY LEDs 36B shown in FIG. 8. Schematically indicated flat circuit board 24D has mounted thereon a first R LED positive voltage lead wire 76, a second G LED positive voltage lead wire 78, a third B LED positive voltage lead wire 80, a fourth Y LED positive voltage lead wire 82, and a fifth common (COM) LED negative voltage lead wire 84, all of which extend in parallel relationship between external power input 56 and external power output 58. Optional resistors 86, 88, 90, and 92 are positioned on first R LED positive voltage lead wire 76, second G LED positive voltage lead wire 78, third B LED positive voltage lead wire 80, and fourth Y LED positive voltage lead wire 82, respectively. LED positive voltage lead wires 76, 78, 80, and 82 are in electrical connection with red, green, blue, and yellow or RGBY LEDs 36B, respectively, which are each connected to fifth common (COM) LED negative voltage lead wire 84. FIG. 11 shows first, second, and third sets of RGBY LEDs 36B all connected in this manner. It is to be understood that additional sets of RGBY LEDs can be added in the same manner as required.

Figure 12:
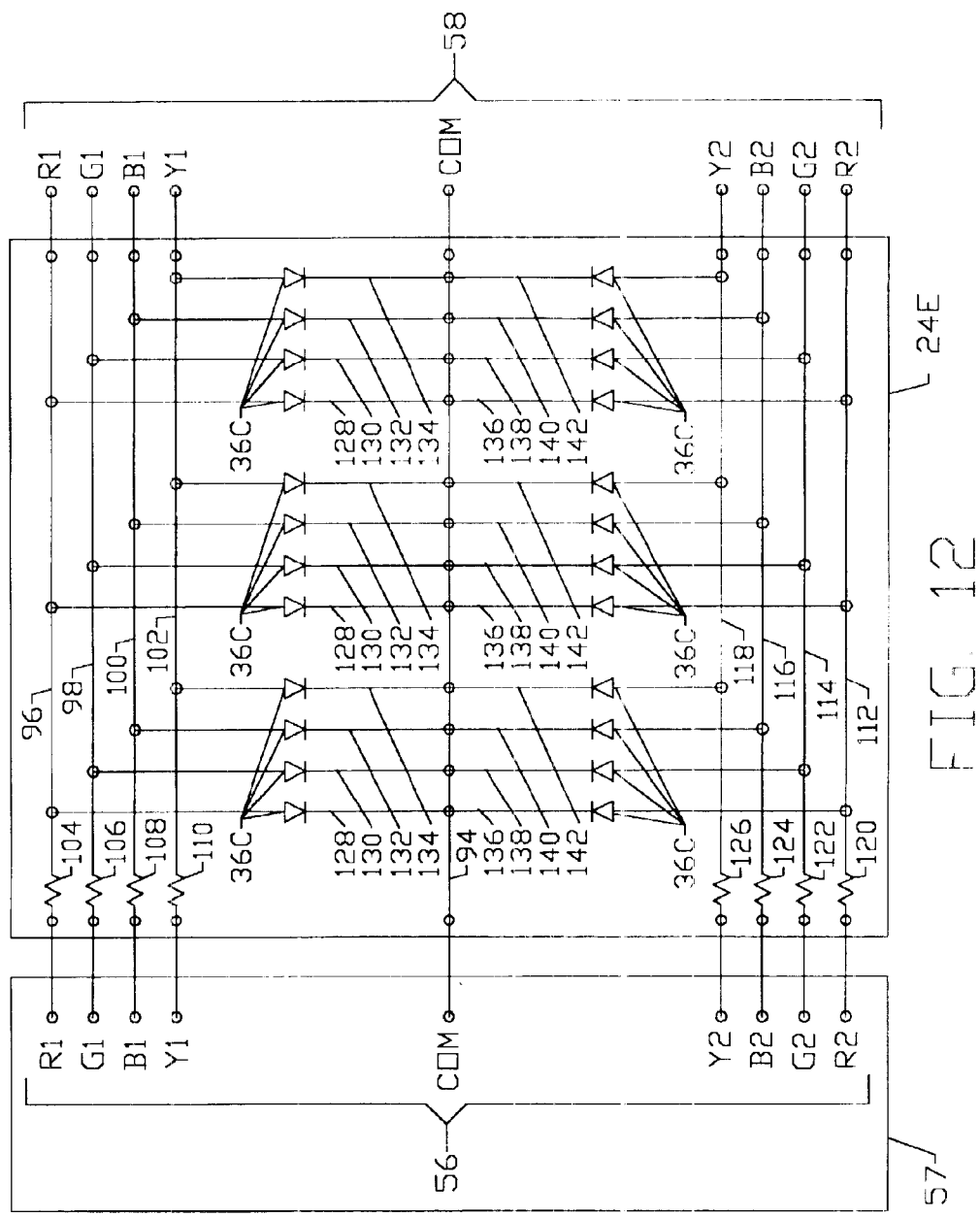
FIG. 12 is a schematic electrical circuit diagram showing the external power supply and controller for color mixing, color changing, and color chasing of the RGBY SMD LEDs shown in FIG. 9 for the most part mounted onto the flexible circuit board.
Figure 14:
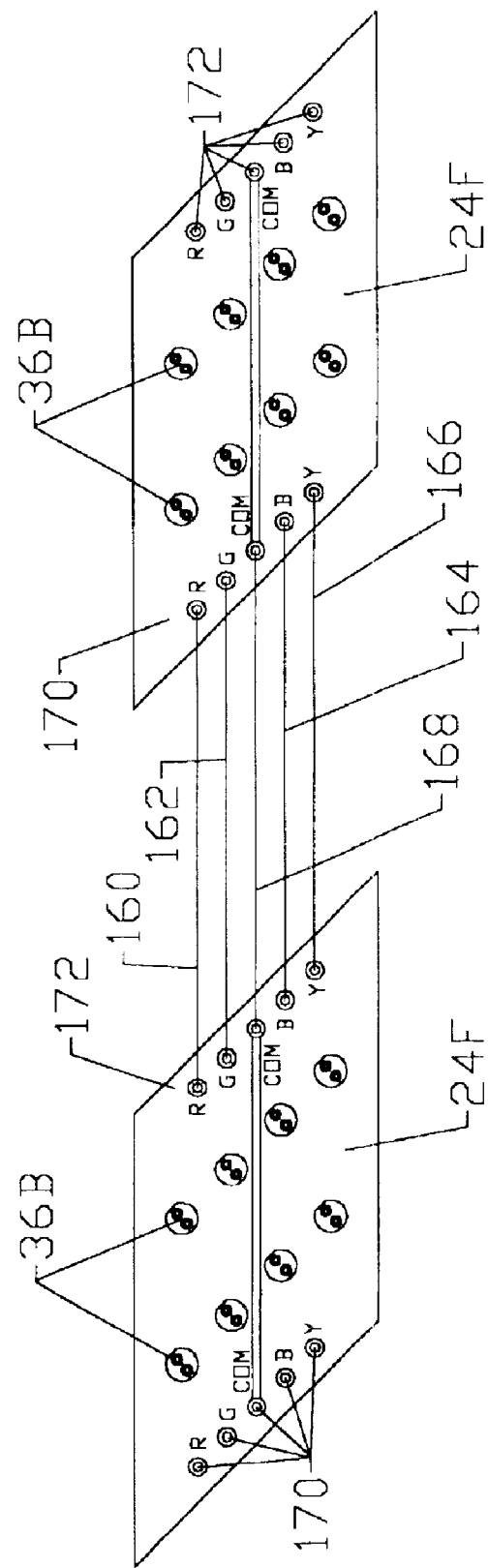
FIG. 14 shows two flexible parallelogram-shaped flat circuit boards spaced apart in a flat mode in a spaced electrically connected relationship with electrical wiring between them prior to being formed into a helical configuration for insertion into a tubular housing such as shown seen in FIG. 1.
Figure 15:
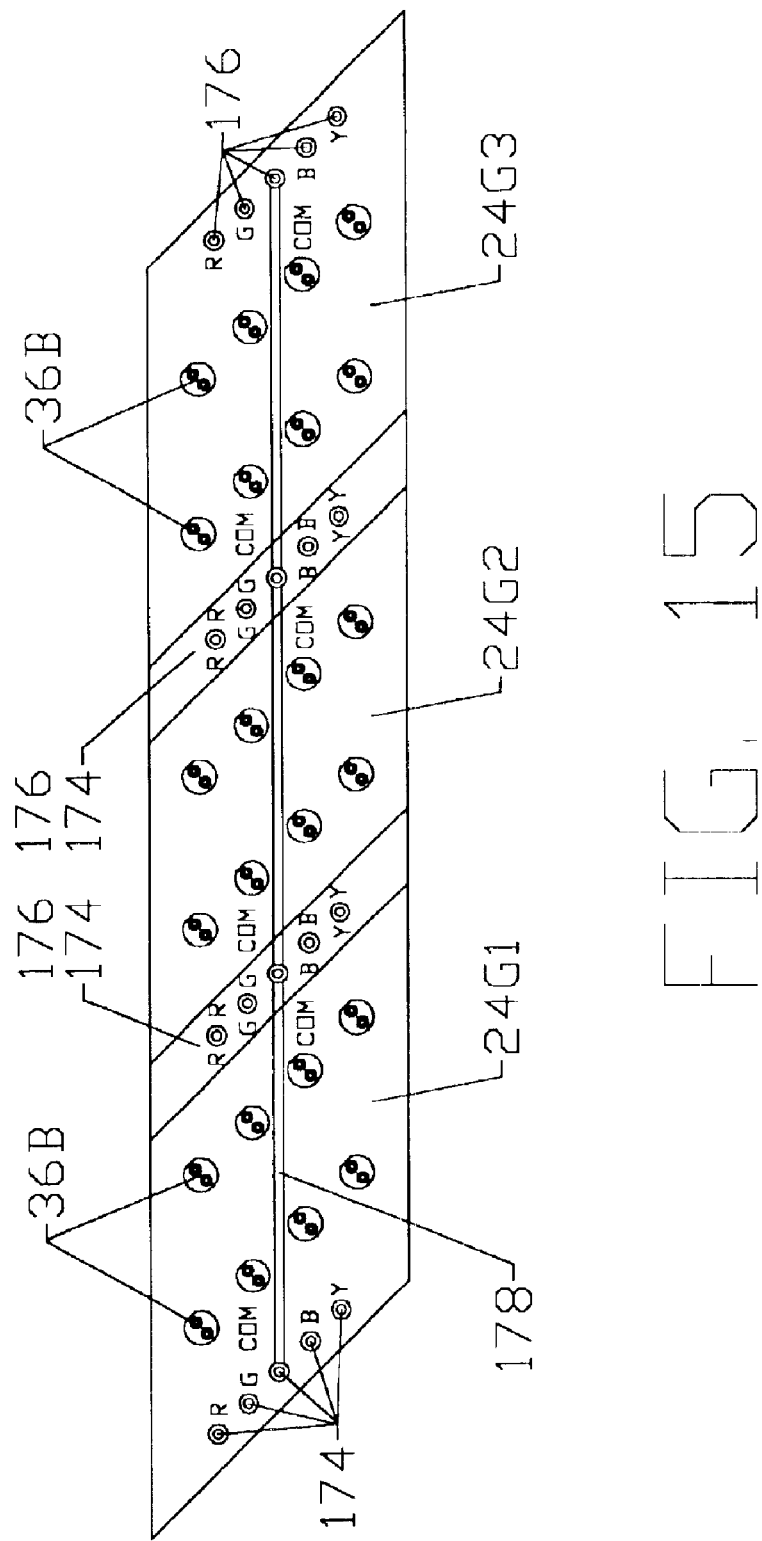
FIG. 15 shows three flexible parallelogram-shaped flat circuit boards in an overlapping cascading relationship in a flat mode prior to being formed into a helical configuration for subsequent insertion into a tubular housing such as shown in FIG. 1.
Figures 16, 16A:
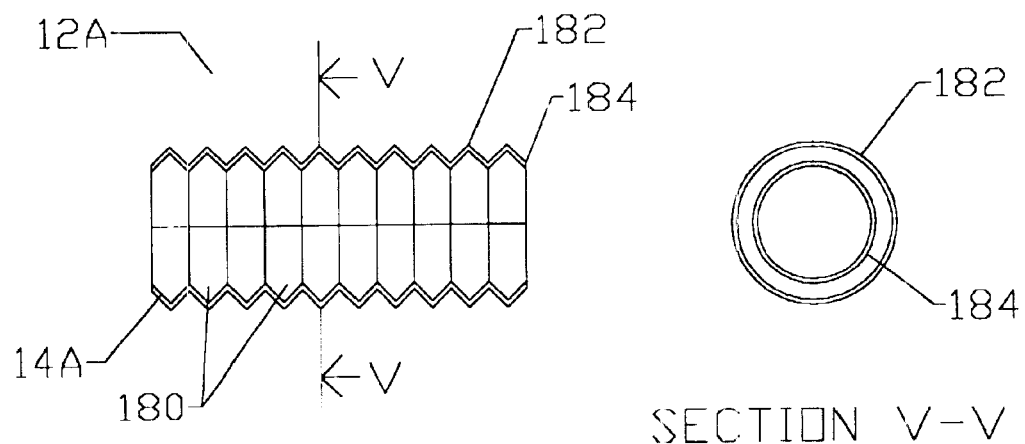
FIG. 16 is an alternate tubular housing with a triangular ribbed outer surface.
FIG. 16A is a view taken through line V—V in FIG. 16.
Figures 17, 17A:
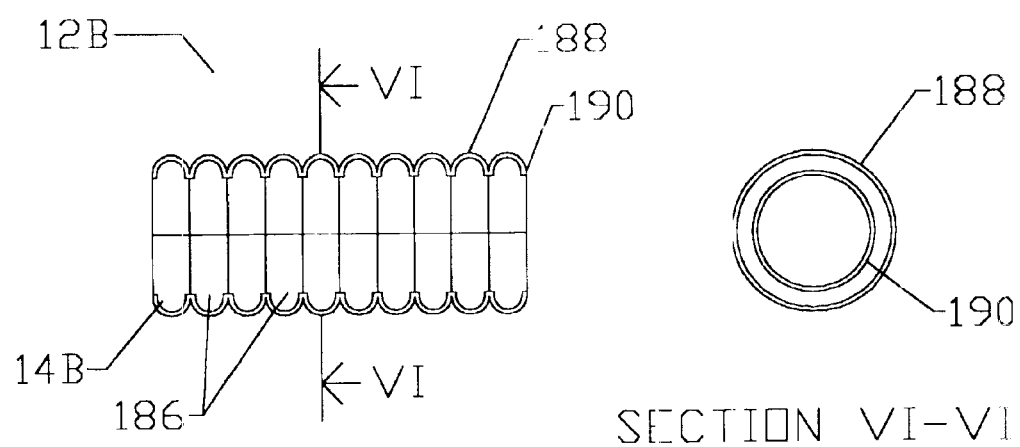
FIG. 17 is an alternate tubular housing with a hemispherical ribbed outer surface.
FIG. 17A is a view taken through line VI—VI in FIG. 17.
Figure 18A:
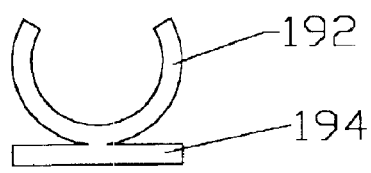
FIG. 18A is an end view of a hemispherical grip for the flexible lighting strip shown in FIG. 1 with a flat holding base.
Figure 18B:
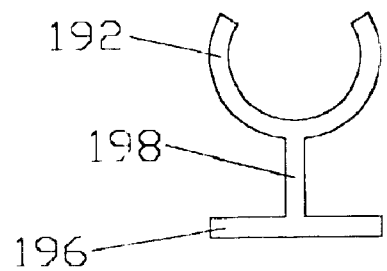
FIG. 18B is an end view of a hemispherical grip for the flexible lighting strip shown in FIG. 1 with a flat holding base connected to the hemispherical grip by a joining member.
Figure 18C:
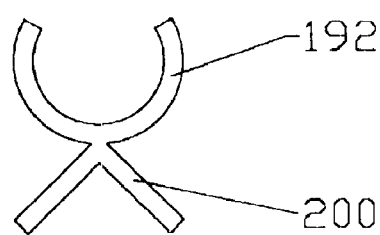
FIG. 18C is an end view of a hemispherical grip for the flexible lighting strip shown in FIG. 1 connected to an outside corner right-angle shaped holding base.
Figure 18D:
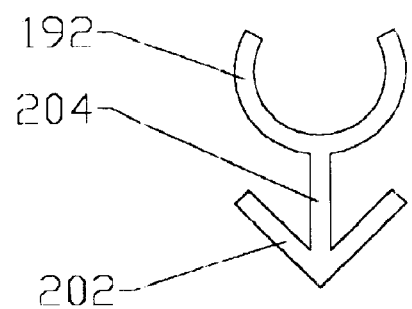
FIG. 18D is an end view of a hemispherical grip for the flexible lighting strip shown in FIG. 1 connected to an inside corner right-angle shaped holding base.
Figure 18E:
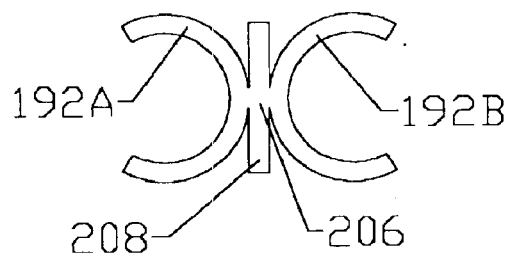
FIG. 18E is an end view of a double-sided hemispherical grip for the flexible lighting strip shown in FIG. 1 each connected to a joining member positioned between them.
Figure 18F:
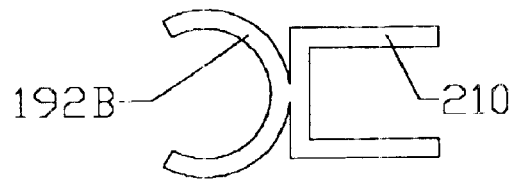
FIG. 18F is an end view of a hemispherical grip for the flexible lighting strip shown in FIG. 1 connected to a U-shaped holding base.

FIG. 12 is a schematic electrical circuit diagram showing the external LED power supply and controller 57 for color mixing, color changing, and color chasing control of the RGBY SMD LEDs 36C shown in FIG. 9 for the most part mounted onto circuit board 24E. For purposes of illustration, FIG. 12 shows 24 RGBY SMD LEDs 36C, but it is to be understood that the same electrical schematic relationship would apply to the 32 RGBY SMD LEDs 36C shown in FIG. 9. Schematically indicated flat circuit board 24E has mounted thereon a central common (COM) LED negative voltage lead wire 94 extending between external power input 56 and external power output 58. A first set of color control includes a R1 LED positive voltage lead wire 96, a G1 LED positive voltage lead wire 98, a B1 LED positive voltage lead wire 100, and a Y1 LED positive voltage lead wire 102 that extend between external power input 56 and external power output 58 each having an optional resistor 104, 106, 108, and 110, respectively. A second set of color control includes a R2 LED positive voltage lead wire 112, a G2 LED positive voltage lead wire 114, a B2 LED positive voltage lead wire 116, and a Y2 LED positive voltage lead wire 118 that extend between external power input 56 and external power output 58 each having an optional resistor 120, 122, 124, and 126, respectively. A first three groups of RGBY SMD LED leads each group comprising R1 LED negative voltage lead 128, G1 LED negative voltage lead 130, B1 LED negative voltage lead 132, and Y1 LED negative voltage lead 134 extend between central common (COM) LED negative voltage lead wire 94 and R1 LED positive voltage lead 96, G1 LED positive voltage lead 98, B1 LED positive voltage lead 100, and Y1 LED positive voltage lead 102, respectively. A second three groups of RGBY SMD LED leads each group comprising R2 LED negative voltage lead 136, G2 LED negative voltage lead 138, B2 LED negative voltage lead 140, and Y2 LED negative voltage lead 142 extend between central common (COM) LED negative voltage lead wire 94 and R2 LED positive voltage lead 112, G2 LED positive voltage lead 114, B2 LED positive voltage lead 116, and Y2 LED positive voltage lead 118, respectively. In each group, R1 LED negative voltage lead 128 and R2 LED negative voltage lead 136 are connected at common (COM) LED negative voltage lead 94; G1 LED negative voltage lead 130 and G2 LED negative voltage lead 138 are connected at common (COM) LED negative voltage lead 94; B1 LED negative voltage lead 132 and B2 LED negative voltage lead 140 are connected at common (COM) LED negative voltage lead 94; and Y1 LED negative voltage lead 134 and Y2 LED negative voltage lead 142 are connected at common (COM) LED negative voltage lead 94. Three double groups of RGBY SMID LEDs 36C are shown to illustrate the operation of the electrical system and additional groups of RGBY SMD LEDs 36C can be added in accordance with the present invention. External LED power supply and controller can turn on the eight R1G1B1Y1R2G2B2Y2 color LED positive voltages individually or collectively to achieve color mixing and color changing, and in an alternating pattern to create a color chasing effect.

It should be noted that someone skilled in the art can arrange and electrically connect the LEDs in FIGS. 10, 11, and 12 as described herein in reverse order such that the main positive voltage power coming from the external power supply and controller 57 to drive each LED are supplied through the common (COM) wire lead and the individual negative voltages are now connected to each white or color LED input voltage wire lead.

A flexible lighting strip 10 is shown in a fully assembled form with hardware connections in FIG. 13 and indicated as assembled flexible lighting strip 10A. The fully assembled flexible lighting strip 10A includes hardware connectors. Fully assembled lighting strip 10A includes flexible lighting strip 10 and connector end caps 20 and 22 mounted to opposed tubular ends 16 and 18. An indoor/outdoor male pin connector 144 is mounted to connector end cap 20 and an indoor/outdoor female socket connector 146 is mounted to connector end cap 22. Male pin connector 144 includes a removable dust cap cover 148 with a flexible cap holder 150 connected to male pin connector 144 for covering male pin connector end 152 is shown in FIG. 13A. Female socket connector 146 includes a removable dust cap cover 154 with a flexible cap holder 156 connected to female socket connector 146 for covering female socket connector end 158 is shown in FIG. 13B.

Fully assembled flexible lighting strip 10A as shown in FIG. 13 includes flexible lighting strip 10 including transparent tubular housing 12 with tubular shell 14, helical circuit board 24 mounted within tubular housing 12 to which are mounted a number of LEDs 36. For example, a complete system of 100 feet of assembled flexible lighting strip 10A can be made in units of 25 feet that is connected as follows: External LED power supply and controller 57 with a pigtail ending in a 5-pin (9-pin for a chasing circuit) female socket connector 146 is attached to the power input 5-pin (9-pin for a chasing circuit) male pin connector 144 of the first 25 feet of flexible lighting strip 10A. This method of connection continues until all four 25 foot lengths of flexible lighting strips 10A are all connected to form one complete 100 feet of flexible lighting strip 10A. When a female socket connector 146 is connected to a male pin connector 144, connector dust cap covers 148 and 154 are not used. Only the last connector in the fully assembled flexible lighting strip 10A has the integral connector dust cap cover 154 snapped over the last female socket connector 146. This completes the 100-foot assembly. It is noted that a special two-fer or Y-splitter cable can be used that basically splits the LED power supply and controller signal from external LED power supply and controller 57 into two lines for additional versatility.

Assembly of the fully assembled flexible lighting strip 10A is in accordance with the following steps:

What is claimed is:

1. A method for making a flexible lighting device including the following steps:
   a. providing a parallelogram-shaped flat circuit board having long edges and short edges with acute angles and obtuse angles, the flat circuit board having opposed interior and exterior surfaces, and further including a stiffening member embedded with the flat circuit board between the long edges and extending beyond the short edges;
   b. mounting electrical circuitry including traces, solder pads and plated through holes, and related electronic components in preparation for a plurality of LEDs to be mounted to the exterior side of the flat circuit board;
   c. securing the plurality of LEDs to the flat circuit board between the long sides and extending generally between the short sides, the LEDs having LED centerlines perpendicular to the flat circuit board;
   d. connecting the LEDs to the electrical circuitry;
   e. providing a flexible hollow tubular housing having a tubular housing length and a tubular housing inner diameter;
   f. forming the flat flexible circuit board into a cylindrical and generally compressed helical circuit board having a predetermined number of compressed spirals with the LEDs extending outwardly from the compressed helical circuit board, so as to form a LED cross-diameter measured across the LEDs that is greater than the tubular housing inner diameter and having a compressed helical circuit board length that is less than the tubular housing length with a rigid pulling wire inserted into the hollow tubular housing with the ends of the rigid pulling wire extending out past opposed tube ends;
   g. attaching one end of the rigid pulling wire extending out past one end of the hollow tubular housing to one end of the compressed helical circuit board; and
   h. pulling the generally compressed helical circuit board into the tubular housing and stretching out the compressed helical circuit board so as to form the calculated number of spirals separated by gaps wherein the compressed helical circuit board now becomes a cylindrical uncompressed flexible helical circuit board having a helical circuit board axis aligned with the tubular housing axis to form a coextensive axis, and wherein the flexible helical circuit board is extended to a helical circuit board length that is generally the same as the tubular housing length and wherein the LED cross-diameter as measured across the LEDs is generally the same as the tubular housing 12 and the LED center lines are perpendicular to the coextensive axis.

2. The method as recited in claim 1, including the following steps:

a. securing power input and power output terminals to the electrical circuitry of the helical circuit board and the LEDs; and b. securing opposed end caps to said opposed ends of the tubular housing.

3. The method as recited in claim 2, further including the steps of:

a. mounting a male pin connector to one of the end caps;

b. mounting a female socket connector to the other of the end caps;

c. mounting a removable dust cap cover with a flexible cap holder to said male pin connector and female socket connector.

* * * * *